United States Patent [19]

Arisaka

[11] Patent Number: 5,538,433
[45] Date of Patent: Jul. 23, 1996

[54] ELECTRICAL CONNECTOR COMPRISING MULTILAYER BASE BOARD ASSEMBLY

[75] Inventor: Hiroshi Arisaka, Tokyo, Japan

[73] Assignee: Kel Corporation, Tokyo, Japan

[21] Appl. No.: 292,500

[22] Filed: Aug. 18, 1994

[30] Foreign Application Priority Data

Aug. 20, 1993 [JP] Japan .................. 5-228266

[51] Int. Cl.⁶ .................................................. H01R 23/76
[52] U.S. Cl. .................. 439/70; 439/608; 174/35 R; 174/266; 333/247; 361/794; 257/691
[58] Field of Search .................... 439/55, 65, 109, 439/70, 85, 608; 174/266, 262, 35 R; 333/1, 246, 247; 361/777, 780, 792, 794, 795; 257/659, 691, 697, 698

[56] References Cited

U.S. PATENT DOCUMENTS

| 4,498,122 | 2/1985 | Rainal | 361/794 |
| 4,821,007 | 4/1989 | Fields et al. | 174/266 |
| 5,102,352 | 4/1992 | Arisaka | 439/608 |
| 5,191,174 | 3/1993 | Chang et al. | 174/266 |
| 5,213,521 | 5/1993 | Arisaka | 439/608 |

FOREIGN PATENT DOCUMENTS

| 1257770 | 12/1971 | United Kingdom | 174/266 |

*Primary Examiner*—Gary F. Paumen
*Attorney, Agent, or Firm*—Robert W. J. Usher

[57] ABSTRACT

A PGA connector for a microprocessor has a multilayer base board assembly with alternating conductive and dielectric layers of preselected thicknesses through which signal pins, current source pins and a grounding pin extend. The signal pins are insulated from the conductive layers and the current and grounding pin are connected to preselected conductive layers. A series of connecting apertures formed by holes with respective conductive linings extend through the layers at selected locations between pins to interconnect selected conductive layers. The connecting apertures interconnect all conductive layers of the base board or, in another example, alternately positioned connecting apertures interconnect only respective different sets of alternately positioned conductive layers of the base board enabling improved shielding and impedance regulation and matching.

11 Claims, 3 Drawing Sheets

5,538,433

ELECTRICAL CONNECTOR COMPRISING MULTILAYER BASE BOARD ASSEMBLY

FIELD OF THE INVENTION

The invention relates to an electrical connector comprising a multilayer base board assembly having alternating conductive and dielectric (insulating) layers in which connecting pins are anchored for effecting connection, for example, between contacts of an integrated circuit component, such as a pin grid array of a microprocessor, and a printed circuit board.

BACKGROUND OF THE INVENTION

The increasing integration and complexity of electronic components such as integrated circuits has resulted in the requirement to transfer large quantities of data with a correspondingly marked increase in the number of leads required for electronic components. At the same time, the inexorable demand for miniaturization requires reduction of the lead pitch to a minimum which increases the incidence of cross-talk between signal pins connected to the leads. The problem of cross-talk, is also exacerbated by the progressive increase in data processing rates, for example, in clock frequencies of central processing units (CPUs), increasing current surges arising from semiconductor switching in the high frequency range, while variations of current source voltages in current supply circuits can readily occur, resulting in an increased risk of operational errors in the circuitry. Furthermore, with increasing signal speeds, the regulation of impedances between pins tends to decrease increasing the risk of mismatching impedances with other, connecting circuits.

SUMMARY OF THE INVENTION

An object of the invention is to provide an electrical connector structure for connecting, for example, an integrated circuit, such as a microprocessor, to a printed circuit board, while alleviating cross talk between signal pins, reducing the impedances of current source and grounding lines and affording impedance matching of signal lines.

The invention provides an electrical connector for connecting an integrated circuit such as a microprocessor to a circuit board comprising: a multilayer base board assembly having opposite faces and comprising a series of conductive and dielectric layers of preselected thicknesses arranged alternately; a plurality of connecting pins including signal pins and at least one of current source pins and a grounding pin, the connecting pins having connecting portions and board anchoring portions and the said at least one of current source pins and a grounding pin having, respectively, conductive layer contacting portions, the connecting pins being inserted in and anchored by their board anchoring portions in the board assembly with the connecting portions exposed to opposite faces and with the conductive layer contacting portions electrically connected to selected conductive layers and with the signal pins insulated from the conductive layers; and, a series of connecting apertures formed by holes with respective conductive linings and formed through layers at selected locations between connecting pins so that the connecting apertures are electrically connected to selected conductive layers thereby electrically interconnecting those selected conductive layers.

In one embodiment, the conductive layers are located at both opposite faces of the base board and a conductive layer on one face is connected to current source pins by their conductive layer contacting portions.

The connecting pins and connecting apertures may be arranged as respective matrices so that individual connecting apertures are located medially between respective groups of four adjacent connecting pins.

In one arrangement, the connecting apertures interconnect all conductive layers of the base board.

In an alternative arrangement, alternately positioned connecting apertures interconnect only respective different sets of alternately positioned conductive layers of the base board and there are four conductive layers and a first and a fourth of the conductive layers are located at respective opposite faces of the base board assembly, the ground and signal connecting pins being connected by their respective conductive layer contacting portions to the fourth and first conductive layers, respectively, thereby providing ground shield and power layers alternating throughout the board assembly and at respective opposite faces thereof.

At least some of the pins may include socket forming portions opening to one face for mating connection with respective leads of a microprocessor.

As the dielectrics forming the laminated base plate perform a shielding function, signal cross-talk between the signal pins is reduced. Furthermore, as the connecting apertures which extend through the base board or base plate between the connecting pins have respective conductive linings or layers which are electrically connected to the conductive layers, the conductive layers and apertures provide shields between adjacent signal pins, further reducing cross-talk between the signal pins. In addition, the connection of the conductive layers with the current source or grounding pins results in a large reduction of the impedances of the current source and grounding lines connected thereto. Furthermore, the thicknesses of the portions of dielectric which extend both between the conductive layers and which surround the signal pins can be adjusted to regulate the impedances of the signal pins enabling impedance matching with other circuits connected through the signal pins.

BRIEF DESCRIPTION OF THE DRAWINGS

Embodiments Of the invention will now be described by way of example only and with reference to the accompanying drawings in which.

DESCRIPTION OF PARTICULAR EMBODIMENTS

As shown in FIGS. 1(a)–3, the first embodiment of electrical connector is a pin grid array (PGA) integrated circuit (IC) socket connector comprising a laminated base board or plate 1, having series of signal pins 2 and current source pins 3 installed thereon.

Figure 3:
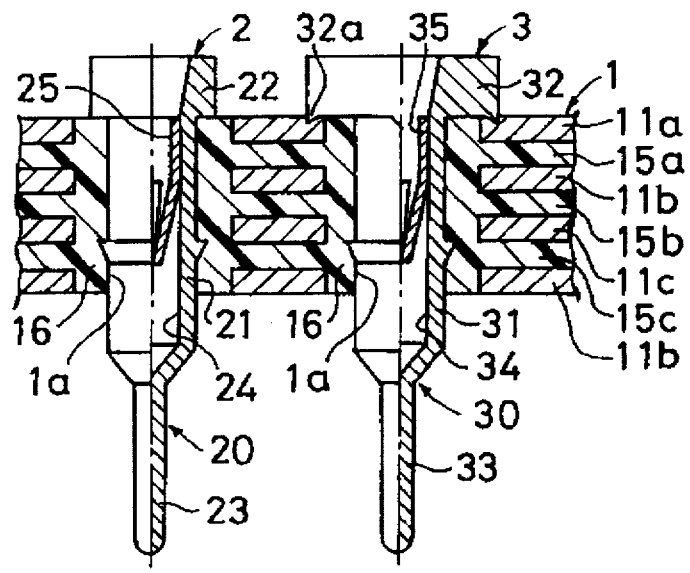
FIGS. 2 and 3 is a fragmentary perspective view, partly in cross-section, of the first embodiment.
Figure 2:
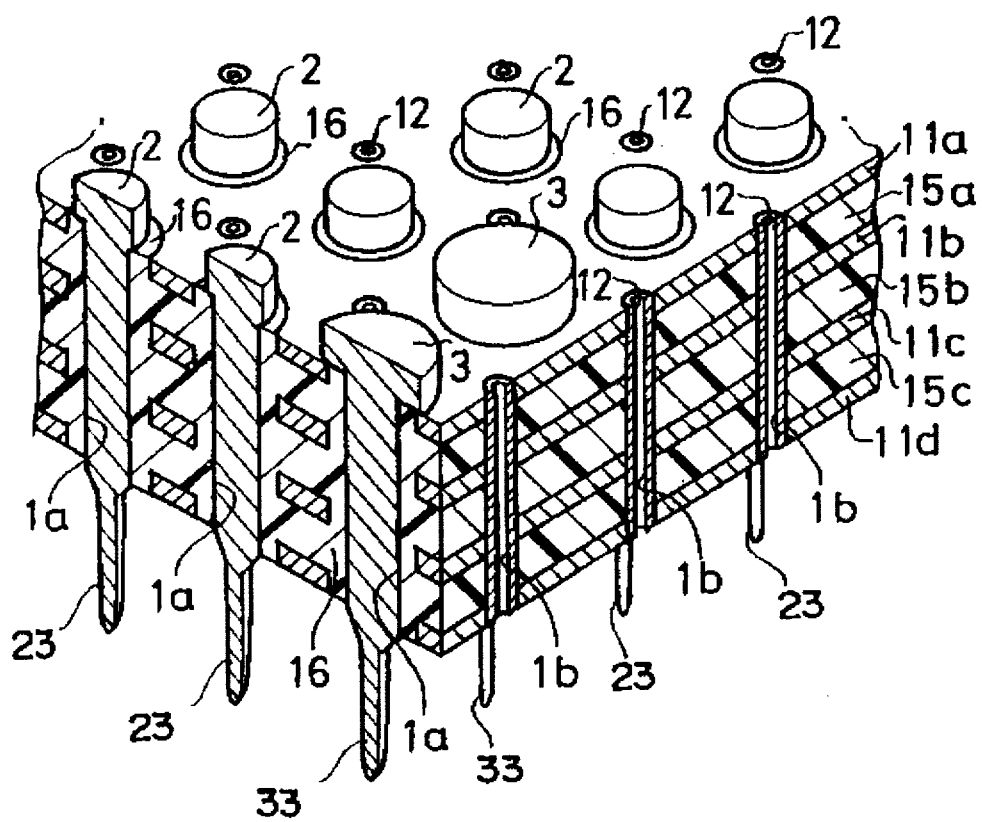

As shown in FIGS. 2 and 3, the base board 1 is formed by laminating first to fourth conductive layers 11a–11d, respectively, alternately with first to third dielectric layers (insulating layers) 15a–15c, respectively so that the first and fourth conductive layers 11a and 11d are exposed at front, component connecting and rear, printed circuit board connecting faces, respectively and the dielectric layers 15a–15c are sandwiched between the conductive layers 11a–11d.

A series of pin receiving through-holes 1a extend perpendicularly through the base board 1 in a matrix formation so as to be surrounded by tubular dielectric portions 16 and either a signal pin 2 or a current source pin 3 is force-fitted in each through-hole.

The signal and current source pins are of similar construction to those described in my application 08/248067, the disclosure of which is incorporate herein by reference.

Each signal pin 2 comprises a one-piece outer body 20, which has a main tubular sleeve-forming anchoring portion 21 with a radially outward extending flange 22 and a depending lead portion 23 on upper and lower ends thereof, respectively. An upward opening inner sleeve 25 is force fitted into an aperture 24 formed in the outer sleeve 20. The flanges 22 provide insertion stops engaging the front face of the board when the signal pins are forcibly inserted in the respective through-holes 1a.

The outer diameter of each flange portion 22 is smaller than the outer diameter of the tubular dielectric portion 16 so that the flange 22 contacts the upper surface of the tubular dielectric layer 16, suitably insulated from the conductive layers.

Each current source pin 3 comprises a one-piece outer body 30, which has a main tubular sleeve-forming anchoring portion 31 with a radially outward extending flange 32 and a depending lead portion 33 on upper and lower ends thereof. An upward opening inner sleeve 35 is force-fitted into an aperture 34 formed in the outer sleeve 30.

The flange portions 32 provide conductive layer contacting portions as their outer diameters are larger than the outer diameter of the tubular dielectric portion 16 so that the flange portions 32 are forced into engagement with the conductive layer on the front surface of the base board during installation. Reliability of connection is assured by the provision of depending annular teeth 32a on the outer peripheral edges of the flange portions which teeth bite into the first conductive layer 11a.

Figure 1:
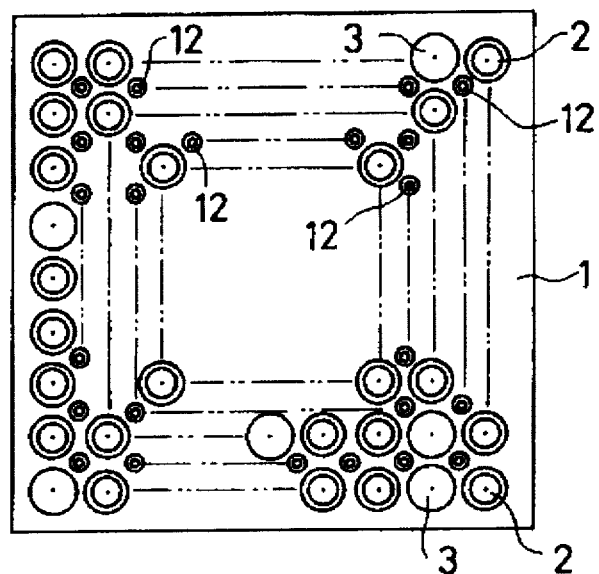
FIG. 1(a) is a plan view of a first embodiment of electrical connector according to the invention.
FIG. 1(b) is a side elevation of the electrical connector shown in FIG. 1(a)
Figure 1:
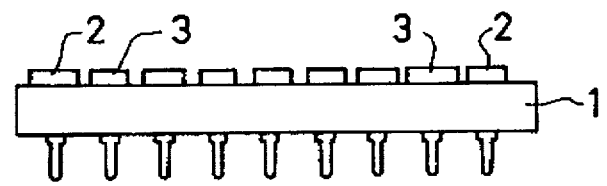

A second series of through-holes 1b are formed in the base board 1 between the holes 1a, also in a matrix formation, as shown in FIG. 1. As shown in FIG. 2, the through-holes 1b, are formed through the conductive layers 11a–11d and the dielectric layers 15a–15c, and a fifth conductive layer or lining 12 is formed on their inner surfaces providing a connecting aperture which interconnects all of the first to fourth conductive layers 11a–11d.

The first to fourth conductive layers 11a–11d, formed as laminated layers, and the fifth conductive layers 12 lining the through-holes 1b are positioned between the main through-holes 1a so that they act as shield layers, so that the signal cross-talk between the signal pins 2 in the main through-holes 1a is greatly reduced.

Figure 4:
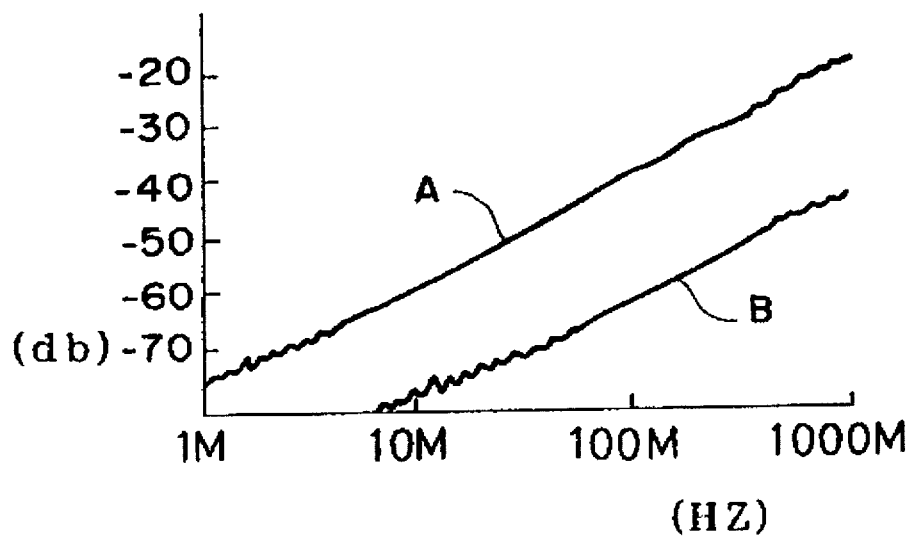
FIG. 4 is a graph showing empirical data concerning cross-talk between adjacent signal pins of the connector shown in FIGS. 1(a)–3 and of a connector of the prior art; and, FIG. 5 is a fragmentary perspective view, partly in cross-section, of another embodiment of electrical connector according to the invention.

FIG. 4 shows the empirical data for cross-talk between adjacent signal pins in the socket connector of the invention described above and for a conventional socket connector) which utilizes a base plate consisting essentially only of a dielectric, without any of the first to fifth conductive layers).

As shown, if the socket connector of this invention is used, the cross-talk property can be reduced by approximately 20 dB, compared to the conventional socket connector.

In general, the capacitance C between 2 conductors facing each other is given by:

$$C = \Sigma \cdot A / d,$$

where A is the surface area of portions of two conductors facing each other, d is the distance between the conductors, and $\Sigma$ is the permittivity of the dielectrics, etc., embedded between the conductors. The impedance is given by:

$$Z = 1/(2\pi f C),$$

where f is the frequency.

Thus, by selecting suitable thicknesses of dielectrics 15a–15c and of the tubular dielectric portions 16 enclosing the signal pins 2, one can (within limits) produce any desired impedance of the signal pins 2 permitting the impedances to easily be matched with other circuits connected to the signal pins 2.

Figure 5:
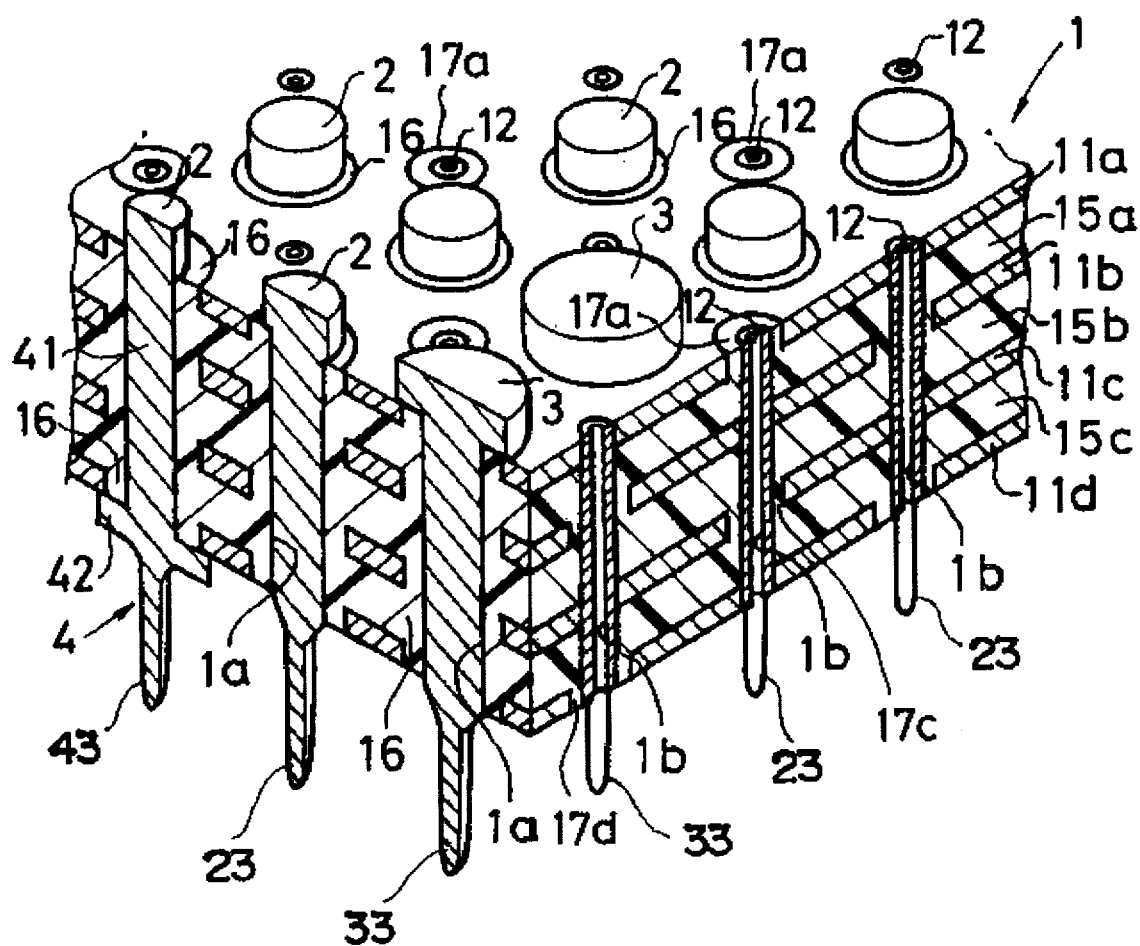

The second embodiment of the invention shown in FIG. 5, is generally similar to the first embodiment shown in FIG. 1–3, with identical parts having been given references to those of the first embodiment.

The connector is formed by force fitting signal pins 2, current source pins 3, and a grounding pin 4 into through-holes holes 1a of a first series, formed in a base board 1. The grounding pin 4 has a flange 42 on the lower end of a main body 41, and is forced into a main penetrating hole 1a from the lower face of the base board 1 until the flange 42 engages the lower face of the base board 1. The outer diameter of flange 42 is larger than the outer diameter of tubular dielectric portion 16 so that the flange 42 establishes electrical connection with the fourth conductive layer 11.

A second series of through-holes 1b are formed in the base board 1 and a fifth conductive layer or lining 12 or 12' is formed on their inner surfaces. Alternating fifth conductive layers 12 and 12', respectively, connect with the first and third conductive layers 11a and 11c and the second and fourth conductive layers 11b and 11d, respectively, so that first and third conductive layers 11a and 11c are electrically connected through the fifth conductive layers 12, and are also connected with the current source pin 3 through the first conductive layer 11. Additionally, the second and fourth conductive layers 11b and 11d are electrically connected through the fifth conductive layers 12', and are also connected electrically with the grounding pin 4 through the fourth conductive layer 11d.

In the second embodiment also, signal cross-talk between adjacent signal pins 2 can be greatly reduced, and impedances matched with other circuits connected through the signal pins 2. Additionally, the impedances of the current source lines connected to the current source pins 3 and the grounding line connected to the grounding pin 4 can also be greatly decreased.

In general, when the connector is required to reduce cross-talk between signal pins, grounding pins are used in the base board assembly and when the connector is required to reduce the the current source impedance, the current source pins are used.

I claim:

1. An electrical connector comprising:

a multilayer base board assembly having opposite faces and comprising a series of conductive and dielectric layers of preselected thicknesses arranged alternately;

a plurality of connecting pins including signal pins and at least one of current source pins and a grounding pin, the connecting pins having connecting portions and board anchoring portions and the at least one of current source pins and a grounding pin having, respectively, conductive layer contacting portions, the connecting pins being inserted in and anchored by their board anchoring portions in the board assembly with the connecting portions exposed to the opposite faces and with the conductive layer contacting portions electrically connected to selected conductive layers and with the signal pins insulated from the conductive layers; and, a series of connecting apertures formed by holes with respective conductive linings and formed through the layers at selected locations between the connecting pins so that the connecting apertures are electrically connected to selected ones of the conductive layers thereby electrically interconnecting those selected conductive layers.

2. An electrical connector according to claim 1 wherein the conductive layers are located at both opposite faces of the base board and a conductive layer on one face is connected to current source pins by their conductive layer contacting portions.

3. An electrical connector according to claim 1 wherein the connecting pins are arranged in a matrix and the connecting apertures are arranged in a matrix so that individual connecting apertures are located medially between respective groups of four adjacent connecting pins.

4. An electrical connector according to claim 1 wherein the connecting apertures interconnect all conductive layers of the base board.

5. An electrical connector according to claim 1 wherein alternately positioned connecting apertures interconnect only respective different sets of alternately positioned conductive layers of the base board.

6. An electrical connector according to claim 5 wherein there are four conductive layers and a first and a fourth of the conductive layers are located at respective opposite faces of the base board assembly.

7. An electrical connector according to claim 6 wherein ground and signal connecting pins are connected by their respective conductive layer contacting portions to the fourth and first conductive layers, respectively, thereby providing ground shield and power layers alternating throughout the board assembly and at respective opposite faces thereof.

8. An electrical connector according to claim 1 wherein the connecting portions of at least some of the pins comprise sockets opening to one face for mating connection with respective leads of a microprocessor.

9. An electrical connector for connecting an integrated circuit such as a microprocessor having a pin grid array to a circuit board comprising:

a multilayer base board assembly having opposite faces and comprising a series of conductive and dielectric layers of preselected thicknesses arranged alternately with the conductive layers at both opposite faces;

a series of connecting pins including signal pins, current source pins and a grounding pin, the connecting pins having respective opposite ends formed with sockets for mating connection with respective leads of a microprocessor and lead pins for connection to a printed circuit board, and formed with board anchoring portions intermediate their opposite ends and the current source pins and grounding pin having, respectively, conductive layer contacting portions, the connecting pins being inserted in and anchored by their board anchoring portions in the board assembly arranged as a matrix with the sockets opening to one face and the lead pins protruding from the opposite face and with the conductive layer contacting portions electrically connected to selected conductive layers and with the signal pins insulated from the conductive layers; and, a series of connecting apertures and formed by holes with respective conductive linings and formed through layers at selected locations between connecting pins so that the connecting apertures are electrically connected to selected conductive layers thereby electrically interconnecting those selected conductive layers, the connecting apertures being arranged as a matrix so that individual connecting apertures are located medially between respective groups of four adjacent connecting pins.

10. An electrical connector according to claim 9 wherein alternately positioned connecting apertures interconnect only respective different sets of alternately positioned conductive layers of the base board.

11. An electrical connector according to claim 10 wherein ground and signal connecting pins are connected by their respective conductive layer contacting portions to respective of the conductive layers on opposite faces, thereby providing ground shield and power layers alternating throughout the board assembly and at respective opposite faces thereof.

* * * * *